United States Patent [19]
Brown

[11] 4,013,916
[45] Mar. 22, 1977

[54] SEGMENTED LIGHT EMITTING DIODE DEFLECTOR SEGMENT

[75] Inventor: Raymond E. Brown, Los Gatos, Calif.

[73] Assignee: Monsanto Company, St. Louis, Mo.

[22] Filed: Oct. 3, 1975

[21] Appl. No.: 619,432

[52] U.S. Cl. ............................. 313/510; 313/499; 313/114

[51] Int. Cl.² ..................................... H01J 1/62

[58] Field of Search .......... 313/510, 113, 114, 111, 313/500, 499

[56] References Cited

UNITED STATES PATENTS

| | | | |
|---|---|---|---|
| 3,290,539 | 12/1966 | Lamorte | 313/114 |
| 3,555,335 | 1/1971 | Johnson | 313/499 |
| 3,774,021 | 11/1973 | Johnson | 313/499 X |
| 3,821,775 | 6/1974 | Biard | 313/499 X |
| 3,876,900 | 4/1975 | Amatsuka et al. | 313/510 |
| 3,883,772 | 5/1975 | Wako et al. | 313/510 X |

*Primary Examiner*—Stanley T. Krawczewicz
*Attorney, Agent, or Firm*—Peter S. Gilster; Harold R. Patton

[57] ABSTRACT

A method and apparatus to improve electroluminescent semiconductor display segments by decreasing the brightness of the "hot spot" located over the light emitting diode and increasing the brightness of the end portions of the segment. These improvements are accomplished by inserting a deflector into the translucent medium directly over the light emitting diode and deflecting, to the segment ends, a portion of the light that would have made up the bright "hot spot."

12 Claims, 6 Drawing Figures

SEGMENTED LIGHT EMITTING DIODE DEFLECTOR SEGMENT

BACKGROUND OF THE INVENTION

The invention relates to a method and an apparatus for use in light emitting diode segmens forming numeric displays such that the individual segment display area is many times that of the diode itself and is particularly useful when the display area is to be a long, narrow rectangle. This invention is of particular applicability to diodes having an approximately Lambertian light emission pattern, where most of the emitted light is in a cone with a half angle of 45° around the normal to the diode.

Segmented light emitting diode displays are well known, especially in the familar seven segment variety that is used in numerical displays. A problem in these segments is that the area of each segment is many times the area of the light emitting diode and where the segment is a long thin rectangle, there is a lack of uniformity to the light given off by the segment. Since the diode chips are normally mounted in the geometric center of the segment there is a "hot spot" or a brighter than average illumination in the region of the segment directly over the diode which detracts from the effectiveness and readability of the display. Light emitting diodes with a Lambertian emission pattern give off most of their light in a cone with a 45° half angle with an axis normal to the diode which accentuates and compounds the hot spot problem.

In the past the general method of reducing "hot spots" was to add a large amount of scattering media to the translucent plastic between the diode and the segment surface. This would diffuse the light emitted by the diode such that there would be a uniformly luminous output but at the cost of a greatly diminished output intensity. Ths scattering of the light results in a 3 to 6% loss in energy each time the diode emitted light is refracted or reflected. If enough scattering material is placed in the translucent medium to achieve a uniform appearance in the segment, the overall light output is diminished considerably and vice versa, if the amount of scattering material is reduced to increase the brightness, the uniformity is impaired thus degrading the quality of the segment.

SUMMARY OF THE INVENTION

Accordingly an object of the present invention is to spread the on-axis diode light in a controlled manner to improve the luminous uniformity of the segment.

A further object is to eliminate the need for high concentrations of scattering material between the diode and the segment surface and thereby increase the segment brilliance.

According to the present invention, the foregoing and other objects are attained by the use of a deflecting surface centrally placed within the cone of light emitted from a diode having an approximately Lambertian distribution. The central deflector is shaped to control the distribution of the emitted light at the segment surface in any desired manner, reflecting it directly to the segment surface or reflecting it first off of the side walls and then to the segment surface.

BRIEF DESCRIPTION OF THE DRAWINGS

A more complete appreciation of the invention and many of the attendant advantages thereof will be readily apparent as the same becomes better understood by reference to the following description when considered in connection with the accompanying drawings wherein.

DETAILED DESCRIPTION OF THE PREFERRED EMBODIMENT

Figure 1:
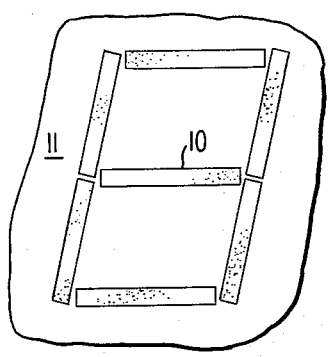
FIG. 1 is a plan view of a typical seven segment display.

Referring now to the drawings wherein like reference numerals designate identical parts throughout the several views. The ivention pertains to the design and operation of light indicating segments as indicated by the numeral 10 in FIG. 1. As shown, the segments 10 are of narrow, bar-shaped configuration. These are typically arranged in a seven segment display indicated generally as 11 where, by illuminating combinations of segments, the numbers 0–9 can be formed. These segments are illuminated by light emitting diodes and are used extensively in solid state display, digital readout meters, etc.

Figure 2:
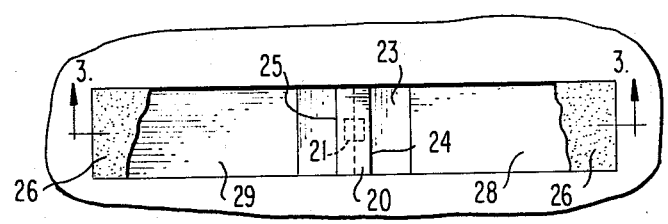
FIG. 2 is a plan view of one segment of the display in FIG. 1.
Figure 3:
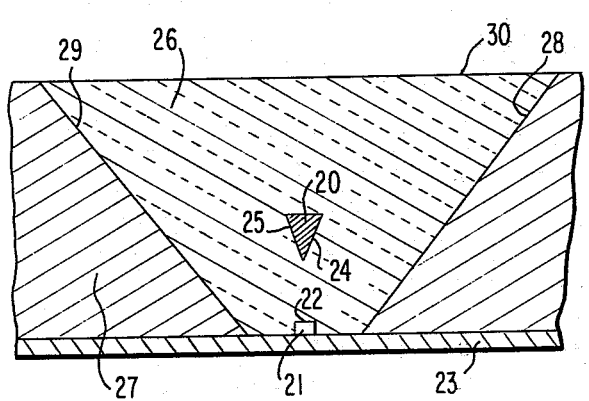
FIG. 3 is a cross-sectional view of the segment shown in FIG. 2.

The invention as shown in FIGS. 2 and 3 is comprised of a deflector body 20 positioned immediately over a light emitting diode 21 with a light emitting surface 22 which is mounted on a substrate base 23. The deflector 20 has reflecting surfaces 24 and 25 and is suspended in a translucent medium 26, surrounded by the reflector casing 27. The casing 27 has reflecting sides 28 and 29 which connect base 23 with lighted surface 30 through which light passes after being emitted by the diode.

Figure 4:
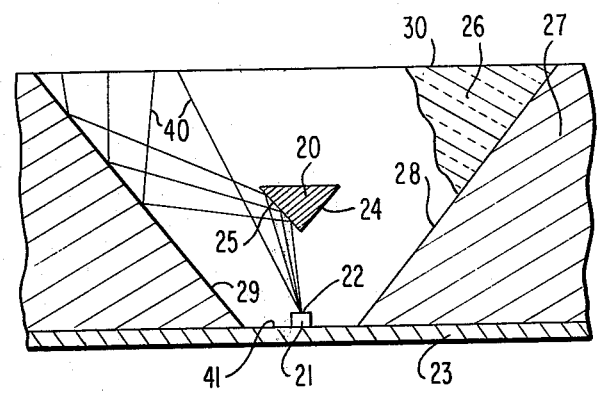
FIG. 4 is a side cross-sectional view of a typical segment showing typical light paths with the central deflector in position.
Figure 5:
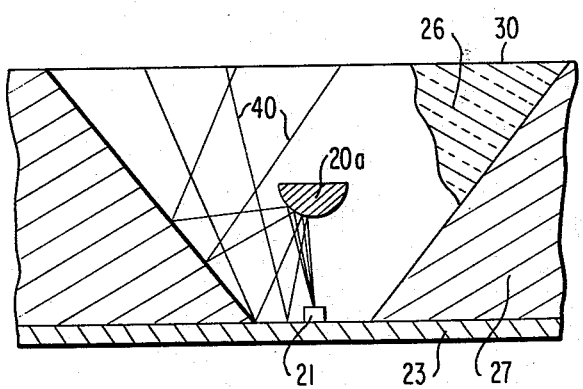
FIG. 5 is a side cross-sectional view of a further embodiment of the central deflector.
Figure 6:
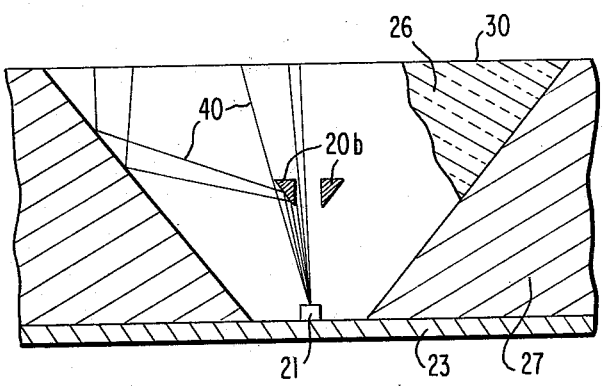
FIG. 6 is a side cross-sectional view of a still futher embodiment of the central deflector.

The operation of the invention is illustrated in FIG. 4. Light is emitted by the diode surface 22 when diode 21 is energized electrically. This light travels upward in a near Lambertian pattern. As shown in FIG. 4, the light rays 40 strike the deflector 20 and are reflected by deflecting surface 25, for example, toward the reflecting side 29 of the reflector casing 27 whereupon it is reflected towards the lighted surface 30. It will be understood by those skilled in the art that surface 24 similarly reflects light toward the surface 28 although this is not shown in FIGS. 4–6 in the interest of clarity of understanding. Because of the deflector 20, the distribution of light is relatively uniform along the lighted surface 30 eliminating the hot spot which is normally located over the diode. In this way, a distribution of light along viewing surface 30 is produced which is different from the Lambertian pattern emitted by the semiconductor. To ensure uniformity, a small amount of scattering material may be added to the translucent medium 26 although the amount would be on the order of 10% of the amount required by conventional display segments.

The deflector 20 and the reflector casing 27 can be constructed with surfaces 24, 25, 28 and 29 silvered as well as constructed from white plastic. The substrate surface 41 which interfaces with medium 26 should be of a reflective nature while the interface of base 23 and reflector casing 27 should be of a light absorbing material to reflect light toward the lighted surface 30 while absorbing any light which may tend to leak toward other adjacent segments.

The deflector 20 is optically shaped so as to provide the distribution of light that is desired at the surface. While deflector 20 in FIG. 4 is a preferred embodiment, the geometric shape could be in the form of a half cylinder, such as the deflector 20a in FIG. 5 or a multiple deflector, such as the deflector 20b in FIG. 6. Instead of the deflector 20 extending the width of segment 10, as in FIG. 2, it may only extend a portion of this distance depending on the desired output. The width of the deflector as well as its vertical location are again matters determined by the desired output although a preferred embodiment has a width of between 2 and 4 times the width of the diode 21.

It can be seen then that the present invention allows the light distribution at the lighted surface 30 to be controlled as a function of optical design rather than as a function of the amount of scattering material that is added to medium 26. Although the invention has been described relative to a specific embodiment thereof, it is not so limited and many modifications and variations thereof will be readily apparent to those skilled in the art in the light of the above teachings. It is therefore understood that within the scope of the appended claims the invention may be practiced otherwise than as specifically described.

What is claimed is:

1. A method of controlling the distribution of light along the surface of an electroluminescent semiconductor display segment, where said segment is comprised of a base, a body of reflector material having an upper and lower surface and an aperture therebetween, said lower surface connected to said base in a lighttight manner, said aperture having reflective sides and a central axis,, an electroluminescent semiconductor attached to said base essentially centrally lcoated in said aperture, said semiconductor having a generally Lambertian pattern of light emission upward from said base the rest of said aperture being substantially occupied by a solid translucent medium from said lower surface to substantially said upper surface forming a viewing surface, said method comprising the step of:
   introducing a deflector body into said translucent medium into said Lambertian pattern of light emission such that light emitted by said semiconductor upon striking said deflector is controllably reflected towards the reflective sides of said aperture and thence to said viewing surface to produce along said viewing surface a distribution of light different from said Lambertian pattern.

2. In a segmented electroluminescent semiconductor display comprised of discreet segments, said segment including a base, a body of reflector material having an upper and lower surface and an aperture therebetween, said lower surface connected to said base in a lighttight manner, said aperture having reflective sides and a central axis between the openings on said lower and upper surfaces, an electroluminescent semiconductor attached to said base essentially on the junction of said axis and said base, said semiconductor having a generally Lambertian pattern of light emission upward from said base said aperture being substantially occupied by a solid transluent medium from said base to essentially said upper surface forming a viewing surface, an improvement comprising:
   a deflector interposed into said Lambertian pattern of light emission between said semiconductor and said viewing surface along said central axis such that at least a portion of the emitted light strikes said deflector and is reflected to the reflective sides and then to the viewing surface in a controlled distribution along said surface of light different from said Lambertian pattern.

3. An apparatus as in claim 2 wherein said deflector and the sides of said opening are coated with a silvering material.

4. An apparatus as in claim 2 wherein said deflector and the sides of said opening are of a substantially white colored material.

5. An apparatus as in claim 2 wherein said deflector extends across said opening.

6. An apparatus as in cliam 5 wherein said deflector cross-section is a triangle.

7. An apparatus as in claim 5 wherein said deflector cross-section is a semi-circle.

8. An apparatus as in claim 2 wherein said deflector is comprised of multiple deflectors.

9. An apparatus as in claim 2 wherein said translucent material includes a light scattering means to more uniformly distribute the light reflected through said material.

10. A segmented electroluminescent semiconductor display comprised of a base, a body of reflector material having an upper and lower surface and a plurality of narrow, bar-shaped apertures therebetween forming a predetermined pattern, said lower surface connected to said base in a lighttight manner, said apertures each having reflective sides and a central axis extending from the plane of the lower surface to the plane of the upper surface, an electroluminescent semiconductor in each apperture attached to said base essentially on the juncture of said axis and said plane of the lower surface, each said semiconductor having a generally Lambertian pattern of light emission upward from said base each of said apertures being substantially occupied by a solid translucent medium from said base to essentially said upper surface forming viewing surfaces which are generally of said narrow bar-shaped configuration extending lengthwise between said sides and a deflecter interposed into said Lambertian pattern of light emission between each of said semiconductors and said viewing surfaces along said central axis wherein light emitted by said semiconductor which strikes said deflector is reflected to the reflective sides and then to the viewing surface in a manner controlled by said deflector to produce along said viewing surfaces a distribution of light different from said Lambertian pattern.

11. A segmented electroluminescent semiconductor display as set forth in claim 10 wherein said deflectors produce at said viewing surfaces relatively uniform distribution of light along the lenght of said viewing surfaces.

12. A segmented electroluminescent semiconductor display as set forth in claim 11 wherein said translucent medium includes light scattering means to more uniformly distribute the light reflected through said medium.

* * * * *